(12) United States Patent
Marchack et al.

(10) Patent No.: US 10,937,945 B2
(45) Date of Patent: Mar. 2, 2021

(54) STRUCTURED PEDESTAL FOR MTJ CONTAINING DEVICES

(71) Applicant: International Business Machines Corporation, Armonk, NY (US)

(72) Inventors: Nathan P. Marchack, New York, NY (US); Bruce B. Doris, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/254,021

(22) Filed: Jan. 22, 2019

(65) Prior Publication Data

US 2020/0235286 A1 Jul. 23, 2020

(51) Int. Cl.
*H01L 43/02* (2006.01)
*H01L 43/12* (2006.01)

(52) U.S. Cl.
CPC .............. *H01L 43/02* (2013.01); *H01L 43/12* (2013.01)

(58) Field of Classification Search
CPC .................................. H01L 43/02; H01L 43/12
See application file for complete search history.

(56) References Cited

U.S. PATENT DOCUMENTS

| 6,259,586 B1* | 7/2001 | Gill | B82Y 10/00 |
| | | | 360/314 |
| 8,087,157 B2* | 1/2012 | Kao | B82Y 10/00 |
| | | | 204/192.34 |
| 8,456,893 B2* | 6/2013 | Horng | H01L 43/12 |
| | | | 365/148 |
| 8,542,524 B2* | 9/2013 | Keshtbod | B82Y 10/00 |
| | | | 365/148 |
| 8,590,139 B2* | 11/2013 | Op De Beeck | H01L 43/12 |
| | | | 216/22 |
| 9,362,336 B2* | 6/2016 | Lu | H01L 27/222 |
| 9,564,577 B1* | 2/2017 | Hsu | H01L 43/02 |
| 9,735,351 B2* | 8/2017 | Lee | H01L 43/12 |
| 9,806,254 B2* | 10/2017 | Sung | H01L 45/12 |
| 9,818,935 B2* | 11/2017 | Chuang | H01L 43/12 |
| 9,893,120 B2* | 2/2018 | Chuang | H01L 27/228 |
| 10,069,064 B1 | 9/2018 | Haq et al. | |
| 10,529,913 B1* | 1/2020 | Chen | H01L 27/228 |
| 10,573,449 B2* | 2/2020 | Sasaki | H01L 43/02 |

(Continued)

OTHER PUBLICATIONS

Nguyen, V., et al., "Novel approach for nanopatterning magnetic tunnel junctions stacks at narrow pitch: A route towards high density STTMRAM applications", 2017 IEEE International Electron Devices Meeting (IEDM), Dec. 2017, 5 pages, San Francisco, CA.

*Primary Examiner* — Ida M Soward
(74) *Attorney, Agent, or Firm* — Scully, Scott, Murphy & Presser, P.C.; Daniel P. Morris, Esq.

(57) ABSTRACT

A magnetic tunnel junction (MTJ) containing device is provided that includes an undercut conductive pedestal structure having a concave sidewall positioned between a bottom electrode and a MTJ pillar. The geometric nature of such a conductive pedestal structure makes the pedestal structure unlikely to be resputtered and deposited on a sidewall of the MTJ pillar, especially the sidewall of the tunnel barrier of the MTJ pillar. Thus, electrical shorts caused by depositing resputtered conductive metal particles on the sidewall of the tunnel barrier of the MTJ pillar are substantially reduced.

11 Claims, 2 Drawing Sheets

(56) References Cited

U.S. PATENT DOCUMENTS

| | | | |
|---|---|---|---|
| 10,615,334 B2* | 4/2020 | Umebayashi | H01L 43/12 |
| 2007/0080381 A1* | 4/2007 | Chien | H01F 10/3254 |
| | | | 257/295 |
| 2009/0087589 A1* | 4/2009 | Guo | B82Y 25/00 |
| | | | 427/599 |
| 2010/0059837 A1* | 3/2010 | Kim | H01L 27/228 |
| | | | 257/421 |
| 2012/0115250 A1 | 5/2012 | Ariga et al. | |
| 2015/0056801 A1* | 2/2015 | Park | H01L 21/76847 |
| | | | 438/655 |
| 2015/0287907 A1* | 10/2015 | Park | G11C 11/161 |
| | | | 257/421 |
| 2017/0301728 A1* | 10/2017 | Chuang | H01L 27/228 |
| 2018/0159023 A1 | 6/2018 | Suh et al. | |
| 2019/0237661 A1* | 8/2019 | Iwata | H01L 43/08 |
| 2019/0371996 A1* | 12/2019 | Chuang | H01L 43/02 |
| 2020/0098982 A1* | 3/2020 | Chuang | H01L 43/12 |
| 2020/0127194 A1* | 4/2020 | Rizzolo | H01L 43/12 |

* cited by examiner

STRUCTURED PEDESTAL FOR MTJ CONTAINING DEVICES

BACKGROUND

The present application relates to a magnetic tunnel junction (MTJ) containing device and a method of forming the same. More particularly, the present application relates to a MTJ containing device that includes a conductive pedestal structure having a concave sidewall and located between a bottom electrode and a MTJ pillar.

Magnetoresistive random access memory (MRAM) is a non-volatile random access memory technology in which data is stored by magnetic storage elements. These elements are typically formed from two ferromagnetic plates, each of which can hold a magnetization, separated by a thin dielectric layer, i.e., the tunnel barrier. One of the two plates is a permanent magnetic set to a particular polarity; the other plate's magnetization can be changed to match that of an external field to store memory. Such a configuration is known as a magnetic tunnel junction (MTJ) pillar.

Conductive pedestals are used in such memory devices to create a physical distance between the bottom electrode and the MTJ pillar. In the prior art, a conductive layer (typically having a lower atomic weight than the bottom electrode) is formed on a surface of a bottom electrode, and then a MTJ stack is formed on the conductive layer. An etch is then performed to provide a MTJ pillar and a conductive pedestal that has a 'foot' or tapered sidewall. This tapered conductive pedestal can pose problems for final cleaning of the sidewall of the MTJ pillar through ion beam etching (IBE) at a different angle, as it is more susceptible to being resputtered and deposited on the sidewall of the MTJ pillar. If resputtered conductive metal particles deposit on the tunnel barrier material of the MTJ pillar, electrical shorts may arise, which is a common failure mode. There is thus a need for a method that can prevent the deposition of such resputtered conductive metal particles from the tapered conductive pedestal structure on the sidewall of the MTJ pillar.

SUMMARY

An undercut conductive pedestal structure having a concave sidewall is formed between a bottom electrode and a MTJ pillar. The geometric nature of such a conductive pedestal structure makes the pedestal structure unlikely to be resputtered and deposited on the sidewall of the MTJ pillar, especially the sidewall of the tunnel barrier material of the MTJ pillar. Thus, electrical shorts caused by depositing resputtered conductive metal particles on the sidewall of the tunnel barrier material of the MTJ pillar are substantially reduced.

In one aspect of the present application, a magnetic tunnel junction (MTJ) containing device such as, for example, a memory device or a sensor is provided. In one embodiment, the MTJ containing device includes a conductive pedestal structure having a concave sidewall located on a bottom electrode. A magnetic tunnel junction (MTJ) pillar is located on the pedestal structure, and a top electrode is located on the MTJ pillar.

In another aspect of the present application, a method of forming a magnetic tunnel junction (MTJ) containing device is provided. In one embodiment, the method includes forming a structure including a conductive layer located on a bottom electrode, a multilayered MTJ stack located on the conductive layer, and a top electrode located on the multilayered MTJ stack. The multilayered MTJ stack and the underlying conductive layer are then etched to provide a MTJ pillar and a conductive pedestal having a tapered sidewall, respectively. Next, a passivation material spacer is formed on a sidewall of each of the top electrode and the MTJ pillar, and on an upper portion of the tapered sidewall of the conductive pedestal. The conductive pedestal having the tapered sidewall is then etched to provide a conductive pedestal structure having a concave sidewall.

DETAILED DESCRIPTION

Figure 1:
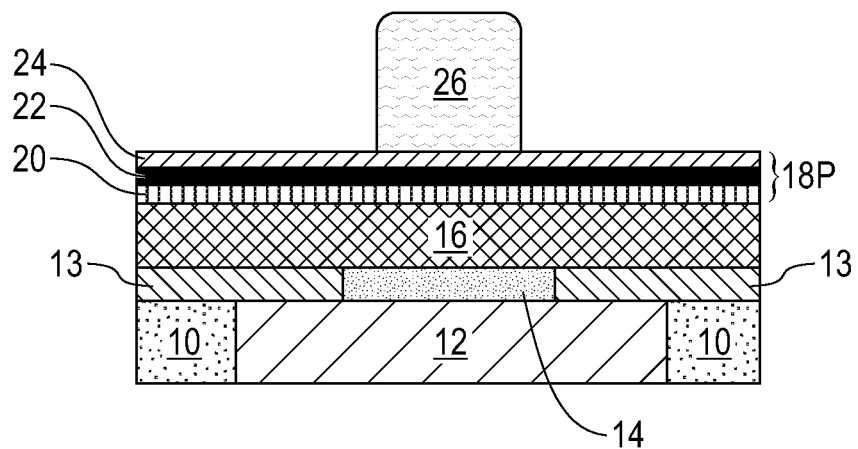
FIG. 1 is a cross sectional view of an exemplary MTJ containing device of the present application and during an early stage of fabrication, the MTJ containing device including a conductive layer located on a surface of a bottom electrode, a multilayered MTJ stack located on the conductive layer, and a top electrode located on the multilayered MTJ stack.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring now to FIG. 1, there is illustrated an exemplary magnetic tunnel junction (MTJ) containing device of the present application and during an early stage of fabrication. Exemplary MTJ containing devices include, but are not limited to, memory devices (e.g., MRAM or spin-transfer torque (STT) MRAM), or sensors such as, for example, pressure sensors. Notably, the exemplary MTJ containing device shown in FIG. 1 includes a conductive layer 16 located on a surface of a bottom electrode 14, a multilayered MTJ stack 18 located on the conductive layer 16, and a top electrode 26 located on the multilayered MTJ stack 18. It is noted that the drawings of the present application illustrate a device area in which a MTJ containing device will be formed. A non-MTJ containing device area may be located adjacent to the MTJ containing device area illustrated in the drawings of the present application. It is also noted that while a single bottom electrode 14 and a single top electrode 26 are described and illustrated, the present application can be used when a plurality of bottom electrodes 14 and a plurality of top electrodes 26 are formed.

As is shown, the bottom electrode 14 is located on a surface of an electrically conductive structure 12 that is embedded in an interconnect dielectric material layer 10. Although not shown, a diffusion barrier liner can be formed on the sidewalls and bottom wall of the electrically conductive structure 12. Collectively, the electrically conductive structure 12, the diffusion barrier liner (if present), and the interconnect dielectric material layer 10 provide an interconnect level It is noted that at least one other interconnect level and/or a middle-of-the-line (MOL) level may be located beneath the interconnect level including the interconnect dielectric material layer 10, the electrically conductive structure 12, and, if present, the diffusion barrier liner. These other levels are not shown for clarity.

The interconnect dielectric material layer 10 can be composed of any interconnect dielectric material including, for example, silicon dioxide, silsesquioxanes, C doped oxides (i.e., organosilicates) that includes atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The electrically conductive structure 12 is composed of an electrically conductive metal or metal alloy. Examples of electrically conductive materials that may be used in the present application include copper (Cu), aluminum (Al), or tungsten (W), while an example of an electrically conductive metal alloy is a Cu—Al alloy.

In some embodiments, a diffusion barrier liner is formed along the sidewalls and a bottom wall of the electrically conductive structure 12. In some embodiments, no diffusion barrier liner is present. The diffusion barrier liner is composed of a diffusion barrier material (i.e., a material that serves as a barrier to prevent a conductive material such as copper from diffusing there through). Examples of diffusion barrier materials that can be used in providing the diffusion barrier liner include, but are not limited to, Ta, TaN, Ti, TiN, Ru, RuN, RuTa, RuTaN, W, or WN. In some embodiments, the diffusion barrier material may include a material stack of diffusion barrier materials. In one example, the diffusion barrier material may be composed of a stack of Ta/TaN.

The interconnect level including the interconnect dielectric material layer 10, the electrically conductive structure 12, and, if present, diffusion barrier liner may be formed utilizing conventional processes that are well-known to those skilled in the art including, for example, a damascene process. So as not to obscure the method of the present application, the techniques used to form the interconnect level including the interconnect dielectric material layer 10, the electrically conductive structure 12, and, if present, the diffusion barrier liner are not provided herein.

In some embodiments (not shown), the bottom electrode 14 is located on a recessed surface of the electrically conductive structure 12. In such an embodiment, and prior to forming the bottom electrode 14, an upper portion of the electrically conductive structure 12 is removed utilizing a recess etching process, and thereafter the bottom electrode 14 is formed upon the recessed surface of the electrically conductive structure 12. In such an embodiment, the bottom electrode 14 would be located on an entirety of the recessed topmost surface of the electrically conductive structure 12. Also, and in such an embodiment, the bottom electrode 14 would have a topmost surface that is coplanar with a topmost surface of the interconnect dielectric material layer 10, and an upper portion of the interconnect dielectric material layer 10 would be laterally adjacent to each sidewall of the bottom electrode 14. Further, and in such an embodiment, dielectric capping layer 13 shown in FIG. 1 can be omitted from the structure.

In other embodiments and as illustrated in FIG. 1, the bottom electrode 14 is formed on a non-recessed surface of the electrically conductive structure 12. In such an embodiment, a dielectric capping layer 13 is located laterally adjacent to the bottom electrode 14 and on a surface of the interconnect dielectric material layer 10. In this embodiment, a smaller width bottom electrode 14 can be provided that does not cover the entirety of the topmost surface of the electrically conductive structure 12.

When present, the dielectric capping layer 13 may be composed of any dielectric material such as, for example, SiC, $Si_3N_4$, $SiO_2$, a carbon doped oxide, a nitrogen and hydrogen doped silicon carbide SiC(N,H) or multilayers thereof. The dielectric capping layer 13 can be formed utilizing a conventional deposition process such as, for example, chemical vapor deposition (CVD), plasma enhanced chemical vapor deposition (PECVD), chemical solution deposition, evaporation, or plasma enhanced atomic layer deposition (PEALD). In some embodiments, and as explained above, the dielectric capping layer 13 may be omitted from the exemplary MTJ containing device. In some embodiments and as is illustrated in FIG. 1, the bottom electrode 14 has a topmost surface that is coplanar with a topmost surface of a dielectric capping layer 13 that may be present laterally adjacent to the bottom electrode 14 and on a topmost surface of the interconnect dielectric material layer 10.

The dielectric capping layer 13 may be formed prior to, or after, forming the bottom electrode 14. In embodiments when the dielectric capping layer 13 is formed prior to the bottom electrode 14, a blanket layer of dielectric capping material is formed and thereafter an opening is formed (by photolithography and etching) in the dielectric capping material. The bottom electrode 14, as defined below, is then formed in the opening. In such an embodiment, the bottom electrode 14 is formed by deposition, followed by a planarization process. In embodiments in which the bottom electrode 14 is formed prior to the dielectric capping layer 13, the bottom electrode is formed by deposition and patterning, and thereafter the dielectric capping material is deposited and a subsequent planarization process may be performed.

Bottom electrode 14, which is present on a surface of the electrically conductive structure 12, may be composed of a conductive material such as, for example, Ta, TaN, Ti, TiN, Ru, RuN, RuTa, RuTaN, Co, CoWP, CoN, W, WN or any combination thereof. The bottom electrode 14 may have a thickness from 2 nm to 25 nm; other thicknesses are possible and can be used in the present application as the thickness of the bottom electrode 14. The bottom electrode 14 may be formed by a deposition process such as, for example, sputtering, atomic layer deposition (ALD), chemical vapor deposition (CVD), plasma enhanced chemical vapor deposition (PECVD) or physical vapor deposition (PVD). An etch back process, a planarization process (such as, for example, chemical mechanical polishing), or a patterning process (such as, for example, lithography and etching) may follow the deposition of the conductive material that provides the bottom electrode 14.

The conductive layer 16 includes any conductive material. In some embodiments, a material that has, or combination of materials that have, a lower atomic weight than the conductive material that provides the bottom electrode 14 can be used as the conductive layer 16. Typically, the conductive material that provides the conductive layer 16 has a lower sticking coefficient than that of the bottom electrode 14. Illustrative examples of conductive materials that can be used as the conductive layer 16 include one of the conductive materials mentioned above for the bottom electrode 14 with the proviso that the selected conductive material of the conductive layer 16 has a lower atomic weight than the conductive material of bottom electrode 14. In one example, and when the bottom electrode 14 is composed of TaN, then the conductive layer 16 is composed of Ti or TiN, or W.

The conductive layer 16 can be formed by a deposition process such as, for example, sputtering, atomic layer deposition (ALD), chemical vapor deposition (CVD), plasma enhanced chemical vapor deposition (PECVD) or physical vapor deposition (PVD). The thickness of the conductive layer 16 may be from 20 nm to 500 nm. Other thicknesses besides the specified range can also be employed as the thickness of the conductive layer 16.

The MTJ stack 18 includes at least a magnetic reference layer 20, a tunnel barrier layer 22, and a magnetic free layer 24 as configured in FIG. 1. Other MTJ stack 18 configurations are possible such as, for example, the magnetic free layer 24 being located at the bottom of the MTJ stack 18 and the magnetic reference layer 20 being at the top of the MTJ stack 18. In some embodiments (not shown), the MTJ stack 18 may also include a non-magnetic spacer layer located on the magnetic free layer, a second magnetic free layer located on the non-magnetic spacer layer, and/or a MTJ cap layer located on the magnetic free layer 24 or on the second magnetic free layer. The various material layers of the MTJ stack 18 can be formed by utilizing one or more deposition processes such as, for example, plating, sputtering, plasma enhanced atomic layer deposition (PEALD), plasma enhanced chemical vapor deposition (PECVD) or physical vapor deposition (PVD).

The magnetic reference layer 20 has a fixed magnetization. The magnetic reference layer 20 may be composed of a metal or metal alloy (or a stack thereof) that includes one or more metals exhibiting high spin polarization. In alternative embodiments, exemplary metals for the formation of the magnetic reference layer 20 include iron, nickel, cobalt, chromium, boron, or manganese. Exemplary metal alloys may include the metals exemplified by the above. In another embodiment, the magnetic reference layer 20 may be a multilayer arrangement having (1) a high spin polarization region formed from of a metal and/or metal alloy using the metals mentioned above, and (2) a region constructed of a material or materials that exhibit strong perpendicular magnetic anisotropy (strong PMA). Exemplary materials with strong PMA that may be used include a metal such as cobalt, nickel, platinum, palladium, iridium, or ruthenium, and may be arranged as alternating layers. The strong PMA region may also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys may be arranged as alternating layers. In one embodiment, combinations of these materials and regions may also be employed.

The tunnel barrier layer 22 is composed of an insulator material and is formed at such a thickness as to provide an appropriate tunneling resistance. Exemplary materials for the tunnel barrier layer 22 include magnesium oxide, aluminum oxide, and titanium oxide, or materials of higher electrical tunnel conductance, such as semiconductors or low-bandgap insulators.

The magnetic free layer 24 may be composed of a magnetic material (or a stack of magnetic materials) with a magnetization that can be changed in orientation relative to the magnetization orientation of the magnetic reference layer 20. Exemplary magnetic materials for the magnetic free layer 24 include alloys and/or multilayers of cobalt, iron, alloys of cobalt-iron, nickel, alloys of nickel-iron, and alloys of cobalt-iron-boron.

If present, the non-magnetic metallic spacer layer is composed of a non-magnetic metal or metal alloy that allows magnetic information to be transferred therethrough and also permits the two magnetic free layers to couple together magnetically, so that in equilibrium the first and second magnetic free layers are always parallel. The non-magnetic metallic spacer layer allows for spin torque switching between the first and second magnetic free layers.

If present, the second magnetic free layer may include one of the magnetic materials mentioned above for magnetic free layer 24. In one embodiment, the second magnetic free layer is composed of a same magnetic material as the magnetic free layer 24. In another embodiment, the second magnetic free layer is composed of a magnetic material that is compositionally different from the magnetic free layer 24.

If present, the MTJ cap layer can be composed of Nb, NbN, W, WN, Ta, TaN, Ti, TiN, Ru, Mo, Cr, V, Pd, Pt, Rh, Sc, Al or other high melting point metals or conductive metal nitrides. The MTJ cap layer may have a thickness from 2 nm to 25 nm; other thicknesses are possible and can be used in the present application as the thickness of the MTJ cap layer.

The top electrode 26 may be composed of one of the conductive materials mentioned above for the bottom electrode 14. The conductive material that provides the top electrode 26 is typically compositionally different from the optional MTJ cap layer. The top electrode 26 can have a thickness within the thickness range mentioned above for the bottom electrode 14. The top electrode 26 may be formed utilizing one of the deposition processes mentioned above in providing the bottom electrode 14, followed by performing a patterning process, such as, for example, photolithography and etching.

Figure 2:
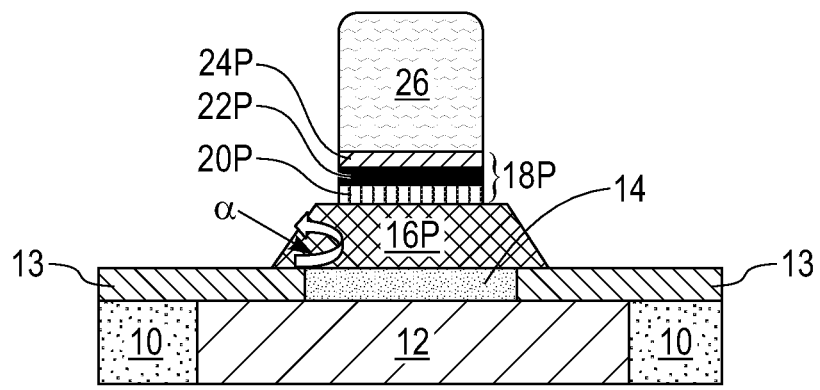
FIG. 2 is a cross sectional view of the exemplary MTJ containing device of FIG. 1 after etching the multilayered MTJ stack and the underlying conductive layer to provide a MTJ pillar and a conductive pedestal having a tapered sidewall, respectively.

Referring now to FIG. 2, there is illustrated the exemplary memory device of FIG. 1 after etching the multilayered MTJ stack 18 and the underlying conductive layer 16 to provide a MTJ pillar 18P and a conductive pedestal 16P having a tapered sidewall, respectively. In the present application, the top electrode 26 serves as an etch mask. The etching of the multilayered MTJ stack 18 and the underlying conductive layer 16 comprises one or more etching steps. The one or more etching steps may include one or more reactive ion etching processes. The MTJ pillar 18P and the top electrode 26 are typically cylindrical in shape. However, other asymmetric shapes are possible and can be utilized in the present application.

As is shown, the MTJ pillar 18P has a sidewall that is vertically aligned to the sidewall of the top electrode 26. The MTJ pillar 18P includes at least a remaining portion of the magnetic reference layer 20 (hereinafter magnetic reference material 20P), a remaining portion of the tunnel barrier layer 22 (hereinafter tunnel barrier material 22P) and a remaining portion of the magnetic free layer 24 (hereinafter magnetic free material 24P). In some embodiments, the MTJ pillar 18P may also include a remaining portion of the non-magnetic spacer, a remaining portion of the second magnetic reference layer, and/or a remaining portion of the MTJ cap layer.

The tapered sidewall of the conductive pedestal 16P extends outward from a topmost surface of the conductive pedestal 16P to a bottommost surface of the conductive pedestal 16P. An angle, $\alpha$, between the bottommost surface of the conductive pedestal 16P, and the tapered sidewall can be from 25° to 85°. Conductive pedestal 16P has a lateral dimension that is greater than a lateral dimension of the MTJ pillar 18P, the top electrode 26 and the bottom electrode 14. The conductive pedestal 16P has a pyramidal shape having a thickness that decreases from the bottommost surface upwards to the topmost surface.

In the prior art and in order to reduce the taper of the pedestal structure, an angled IBE process is now typically performed. However, if such an angled IBE is used, conductive metal particles are resputtered from the pedestal structure and such resputtered metal particles can deposit on the sidewall of the MTJ pillar. As mentioned above, such resputtered conductive metal particles that deposit on the sidewall of the MTJ pillar causes electrical shorts. Thus, and in the present application, such an angled IBE is not performed at this stage of the present application.

Figure 3:
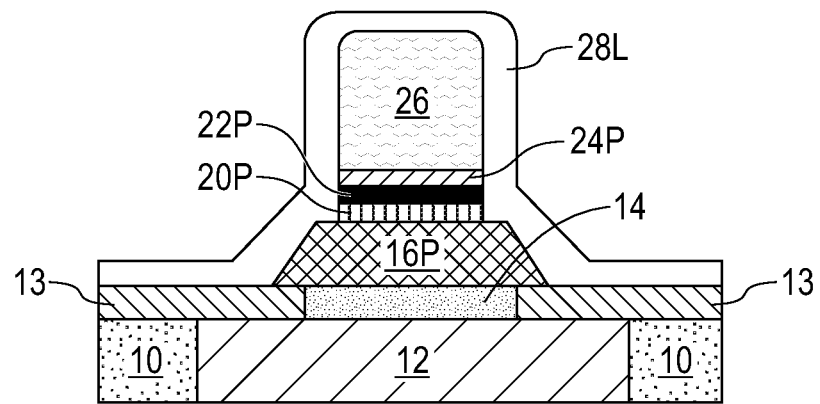
FIG. 3 is a cross sectional view of the exemplary MTJ containing device of FIG. 2 after forming a passivation material layer on the physically exposed surfaces of the top electrode, the MTJ pillar and the conductive pedestal having the tapered sidewall.

Referring now to FIG. 3, there is illustrated the exemplary memory device of FIG. 2 after forming a passivation material layer 28L on the physically exposed surfaces of the top electrode 26, the MTJ pillar 18P and the conductive pedestal 16P. The passivation material layer 28L also extends onto the physically exposed surface of either the dielectric capping layer 13 or the interconnect dielectric material layer 10.

The passivation material layer 28L is composed of a dielectric material. In one example, the passivation material layer 28L is composed of silicon nitride. In another example, the passivation material layer 28L may be composed of a dielectric material that contains atoms of silicon, carbon and hydrogen. In some embodiments, and in addition to atoms of carbon and hydrogen, the dielectric material may include atoms of at least one of nitrogen and oxygen. In other embodiments, and in addition to atoms of silicon, nitrogen, carbon and hydrogen, the dielectric material may include atoms of boron. In one example, the passivation material layer 28L may be composed of an nBLOK dielectric material that contains atoms of silicon, carbon, nitrogen and oxygen. In alternative example, the passivation material layer 28L may be composed of a SiBCN dielectric material that contains atoms of silicon, boron, carbon, hydrogen, and nitrogen.

The passivation material layer 28L can be formed utilizing a deposition process such as, for example, PECVD, PVD, or PEALD. The passivation material layer 28L may have a thickness from 10 nm to 200 nm. Other thicknesses are possible and can be employed as the thickness of the passivation material layer 28L. In some embodiments, the passivation material layer 28L has a conformal thickness. The term "conformal" denotes that a material layer has a vertical thickness along horizontal surfaces that is substantially the same (i.e., within ±5%) as the lateral thickness along vertical surfaces.

Figure 4:
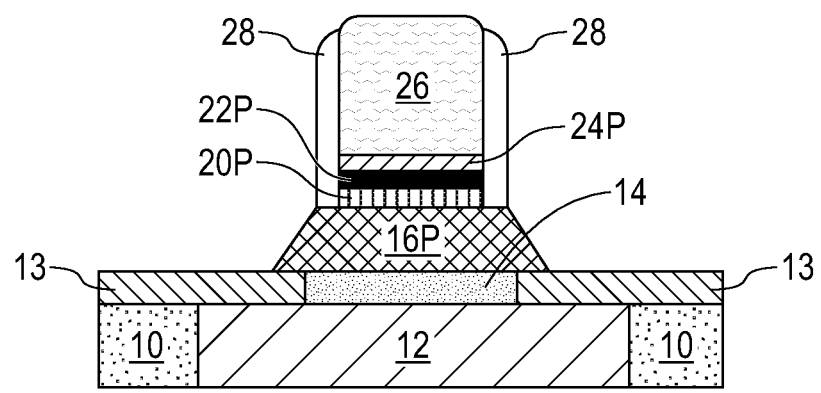
FIG. 4 is a cross sectional view of the exemplary memory device of FIG. 3 after etching the passivation material layer to provide a passivation material spacer on a sidewall of each of the top electrode and the MTJ pillar, and on an upper portion of the tapered sidewall of the conductive pedestal.

Referring now to FIG. 4, there is illustrated the exemplary memory device of FIG. 3 after etching the passivation material layer 28L to provide a passivation material spacer 28 on the sidewall of each of the top electrode 26 and the MTJ pillar 18P, and on an upper portion of the tapered sidewall of the conductive pedestal 16P. The etching of the passivation material layer 28L may be performed utilizing any spacer etching process such as, for example, reactive ion etching, that is selective for removing passivation material.

Figure 5:
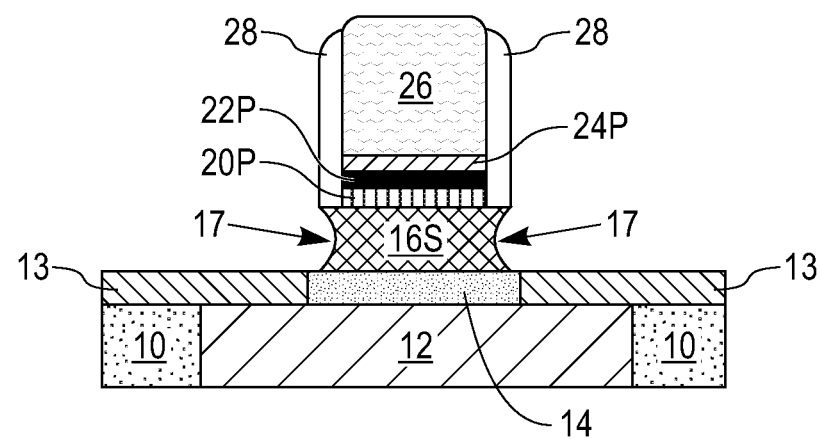
FIG. 5 is a cross sectional view of the exemplary MTJ containing device of FIG. 4 after etching the conductive pedestal having the tapered sidewall to provide a conductive pedestal structure having a concave sidewall.

Referring now to FIG. 5, there is illustrated the exemplary memory device of FIG. 4 after etching the conductive pedestal 16P having the tapered sidewall to provide a conductive pedestal structure 16S having a concave sidewall 17. The conductive pedestal structure 16S has an hour-glass shape. That is, the conductive pedestal structure has an undercut along the outermost sidewall as shown in FIG. 5; the undercut may extend inwards from 2 nm to 30 nm from the outermost sidewall of the passivation material spacer 28. The concave sidewall 17 of the conductive pedestal structure 16S is shielded from impinging ions by the overhang of the elements that are located above the conductive pedestal structure 16S. The geometric nature of the conductive pedestal structure 16S makes the conductive pedestal structure 16S of the present application unlikely to be resputtered and deposited on the sidewall of the MTJ pillar 18P, especially the sidewall of the tunnel barrier 22P of the MTJ pillar 18P. Thus, electrical shorts caused by depositing resputtered conductive metal particles are substantially eliminated.

The etching used in this step of the present application is selective in removing the conductive material that provides the conductive pedestal 16P. In one example, a reactive ion etch can be used at this point of the present application. The etching used in this step of the present application uses the passivation material spacer 28 and the top electrode 26 has an etch mask.

In some embodiments, the passivation material spacer 28 may be thinned during this step of the present application. The thinned or non-thinned passivation material spacer 28 is located on the sidewall of each of the top electrode 26 and the MTJ pillar 18P and contacts a topmost surface of the conductive pedestal structure 16S. As is shown in FIG. 5, the concave sidewall 17 of the conductive pedestal structure 16S is located directly beneath the passivation material spacer 28. The conductive pedestal structure 16S does not extend beyond an outermost sidewall of the thinned or non-thinned passivation material spacer 28.

Notably, FIG. 5 illustrates an exemplary memory device that includes a conductive pedestal structure 16S having a concave sidewall 17 located on a bottom electrode 14. A magnetic tunnel junction (MTJ) pillar (20P/22P/24P) is located on the conductive pedestal structure 16S, and a top electrode 26 is located on the MTJ pillar (20P/22P/24P). Stated in other terms, an hour-glass shaped conductive pedestal structure 16S is located between the bottom electrode 14 and the MTJ pillar 18P.

At this point of the present application, an angled IBE process, to remove residual metallic materials from the tunnel barrier material 22P, can now be performed. Unlike the prior art, and due to the geometry of the pedestal structure 16S and the passivation spacer 28, substantially no conductive metal particles that may be resputtered from the pedestal structure 16S deposit on the sidewall of the MTJ pillar 18P thus reducing the possibility of electrical shorts caused by the redeposit conductive metal particles. Thus, and in the present application, improved device performance, in terms of a reduction in failure mode, can be obtained.

Although not shown, another electrically conductive structure is formed contacting a surface of the top electrode 26. This other electrically conductive structure is embedded in another interconnect dielectric material that is formed laterally adjacent to, and above, the stack including the pedestal structure 16S, the MTJ pillar 18P, and the top electrode 26.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A magnetic tunnel junction (MTJ) containing device comprising:
   a conductive pedestal structure having an outermost sidewall, as measured from a topmost surface of the conductive pedestal structure to the bottommost surface of the conductive pedestal structure, that is entirely concave, wherein the conductive pedestal structure is located on a bottom electrode;
   a magnetic tunnel junction (MTJ) pillar located on the conductive pedestal structure;
   a top electrode located on the MTJ pillar; and
   a passivation material spacer located on the sidewall of each of the top electrode and the MTJ pillar and contacting the topmost surface of the conductive pedestal structure.

2. The MTJ containing device of claim 1, wherein the outermost sidewall of the conductive pedestal structure is located directly beneath the passivation material spacer.

3. The MTJ containing device of claim 1, wherein the conductive pedestal structure has a hour-glass shape.

4. The MTJ containing device of claim 1, wherein the bottom electrode is located on a surface of an electrically conductive structure, and the electrically conductive structure is embedded in an interconnect dielectric material layer.

5. The MTJ containing device of claim 1, wherein the conductive pedestal structure is located on a non-recessed surface of the bottom electrode, and wherein a dielectric capping layer is located laterally adjacent to the bottom electrode.

6. The MTJ containing device of claim 1, wherein the MTJ pillar comprises a magnetic reference material, a tunnel barrier material, and a magnetic free material, wherein the magnetic reference material forms an interface with the conductive pedestal structure.

7. The MTJ containing device of claim 1, wherein the conductive pedestal structure is composed of a conductive material having a lower atomic weight than a conductive material that provides the bottom electrode.

8. The MTJ containing device of claim 1, wherein no resputtered conductive metal particles are present on a sidewall of the MTJ pillar.

9. The MTJ containing device of claim 1, wherein the conductive pedestal structure, the MTJ pillar, and the top electrode are components of a memory device or a sensor.

10. A magnetic tunnel junction (MTJ) containing device comprising:
    a conductive pedestal structure having an outermost sidewall, as measured from a topmost surface of the conductive pedestal structure to the bottommost surface of the conductive pedestal structure, that is entirely concave, wherein the conductive pedestal structure is located on a bottom electrode;
    a magnetic tunnel junction (MTJ) pillar located on the conductive pedestal structure; and
    a top electrode located on the MTJ pillar, wherein the bottom electrode is located on a surface of an electrically conductive structure, and the electrically conductive structure is embedded in an interconnect dielectric material layer.

11. A magnetic tunnel junction (MTJ) containing device comprising:
    conductive pedestal structure having an outermost sidewall, as measured from a topmost surface of the conductive pedestal structure to the bottommost surface of the conductive pedestal structure, that is entirely concave, wherein the conductive pedestal structure is located on a non-recessed surface of a bottom electrode;
    a magnetic tunnel junction (MTJ) pillar located on the conductive pedestal structure;
    a top electrode located on the MTJ pillar; and
    a dielectric capping layer located laterally adjacent to the bottom electrode.

* * * * *